(12) United States Patent
Bang

(10) Patent No.: US 8,790,460 B2
(45) Date of Patent: Jul. 29, 2014

(54) FORMATION OF SILICON SHEETS BY IMPINGING FLUID

(75) Inventor: Christopher A Bang, Studio City, CA (US)

(73) Assignee: Empire Technology Development LLC, Wilmington, DE (US)

( * ) Notice: Subject to any disclaimer, the term of this patent is extended or adjusted under 35 U.S.C. 154(b) by 604 days.

(21) Appl. No.: 12/467,753

(22) Filed: May 18, 2009

(65) Prior Publication Data

US 2010/0288186 A1 Nov. 18, 2010

(51) Int. Cl.
*C30B 15/00* (2006.01)
*C30B 21/06* (2006.01)
*C30B 27/02* (2006.01)
*C30B 28/10* (2006.01)
*C30B 30/04* (2006.01)

(52) U.S. Cl.
USPC .................................. 117/28; 117/23; 117/26

(58) Field of Classification Search
USPC ...................................................... 117/23, 26
See application file for complete search history.

(56) References Cited

U.S. PATENT DOCUMENTS

| | | | | |
|---|---|---|---|---|
| 3,293,002 A | * | 12/1966 | Spielmann et al. | 117/32 |
| 4,090,851 A | | 5/1978 | Berkman et al. | |
| 4,121,965 A | * | 10/1978 | Leipold | 117/26 |
| 4,428,783 A | * | 1/1984 | Gessert | 117/22 |
| 4,557,793 A | * | 12/1985 | Foell et al. | 117/23 |
| 4,690,797 A | | 9/1987 | Eyer et al. | |
| 4,770,738 A | * | 9/1988 | Robillard | 117/23 |
| 5,919,304 A | * | 7/1999 | Imaeda et al. | 117/26 |
| 6,074,477 A | * | 6/2000 | Imaeda et al. | 117/23 |
| 6,315,828 B1 | * | 11/2001 | Holder et al. | 117/208 |
| 7,344,594 B2 | * | 3/2008 | Holder | 117/23 |
| 2005/0279278 A1 | * | 12/2005 | Holder | 117/23 |

FOREIGN PATENT DOCUMENTS

| | | |
|---|---|---|
| JP | 57-118089 A | 7/1982 |
| JP | 2001-122696 A | 5/2001 |

OTHER PUBLICATIONS

Bergmann, R.B., "Crystalline Si thin-film solar cells: a review", Appl. Phys. A 69, 187-194, 1999.
Sze, S.M., "Czochralski Crystal Growing", VLSI Technology, McGraw Hill, Chapter 1, 21 pages, 1983.
Tsuo, Y. Simon et al., "Hydrogen passivation of silicon sheet solar cells", Appl. Phys. Lett. 45 (9), Nov. 1984, pp. 971-973.
"Silicon for Solar Cells", http://www.tf.unikiel.de/matwis/amat/semi_en/kap_3/backbone/r3_2_2.html.
McCann, et al., "A Review of Thin Film Crystalline Silicon for Solar Cell Applications. Part 1: Native Substrates", Solar Energy Materials and Solar Cells, vol. 68, 2001, pp. 135-171.

* cited by examiner

*Primary Examiner* — Kaj K Olsen
*Assistant Examiner* — Ross J Christie
(74) *Attorney, Agent, or Firm* — Dorsey & Whitney LLP

(57) ABSTRACT

Techniques are generally disclosed for forming crystalline bodies. An example system, device or method for forming crystalline bodies may include a crucible for containing molten crystalline material and a support for accommodating a seed on an end thereof, the support being movable along a translation axis in a pull direction to draw the seed crystal from the molten crystalline, thereby initiating growth of a crystalline body along a growth path. Further examples may include one or more nozzles configured to be coupled to a fluid source, the nozzles being positioned relative to the growth path for shaping the crystal body as the molten crystalline is pulled in the pull direction along the growth path.

9 Claims, 4 Drawing Sheets

FORMATION OF SILICON SHEETS BY IMPINGING FLUID

BACKGROUND

A method for forming silicon wafers involves growing a large cylindrical ingot from molten silicon and subsequently, slicing the ingot into wafers and polishing the wafers to form finished a finished wafer product. Silicon in this form is used, for example, by the semiconductor industry to form integrated circuits as well as in the solar industry to form solar panels. The aforementioned process is economical for the semiconductor industry because thousands of integrated circuits can be fabricated from a single wafer. The process, however, is less amenable to the fabrication of solar panels.

In the formation of solar panels, individual solar cells are typically formed on the silicon wafers. The surface area of the silicon wafers, however, is far less than that required for a typical solar cell, and thus, the individual cells must then be tiled and wired together to form a single solar panel capable of absorbing energy over a large area.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings.

In the drawings.

DETAILED DESCRIPTION

Figure 1:
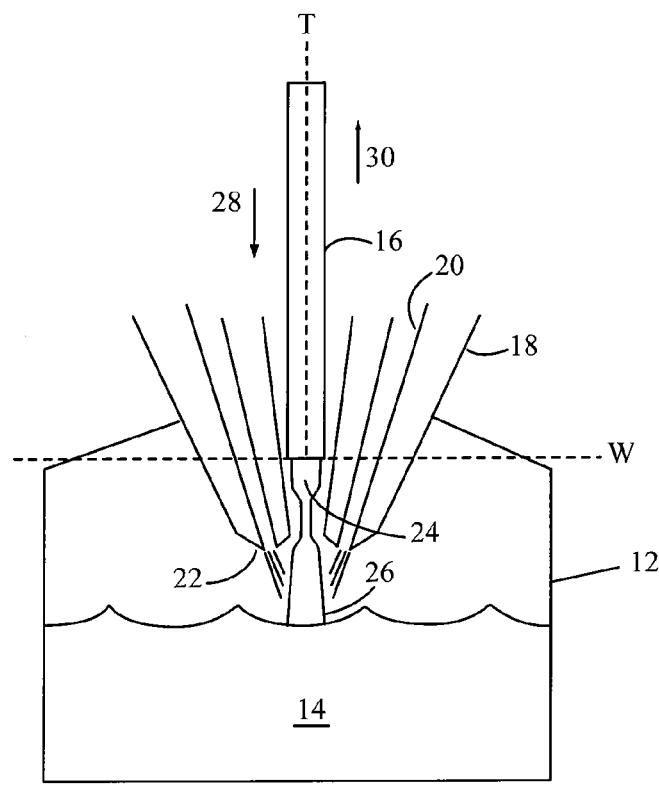
FIG. 1 depicts a cross-sectional view of a system for fabricating crystalline bodies, in accordance with some examples.

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly and implicitly contemplated herein.

The present disclosure is drawn, inter alia, to methods, apparatus, and systems related to formation of crystalline bodies, and more specifically, fabricating high performance crystalline bodies which resemble the geometric shape and/or size of which is to be assumed during production of the product to be formed from the crystalline body such as, for example, thin-sheet/large area crystalline bodies. Such systems and methods may, for example, facilitate reduction of processing costs associated with post-formation processing of crystalline bodies to form a desired product (e.g., slicing, polishing, material waste). While the disclosure may make specific reference to formation of specific shapes of crystalline bodies and specific crystalline materials, it is to be appreciated that the systems and methods disclosed herein may be used to form a variety of crystalline materials into a variety of shapes.

In the solar industry, where it is beneficial to cover large areas with silicon, processes such as disclosed herein for growing crystalline silicon into large area bodies, such as thin sheets, may be useful. Such processes may provide economic advantages over the traditional methods by limiting the cost intensive efforts of slicing and tiling as well as limiting material waste.

Figure 2:
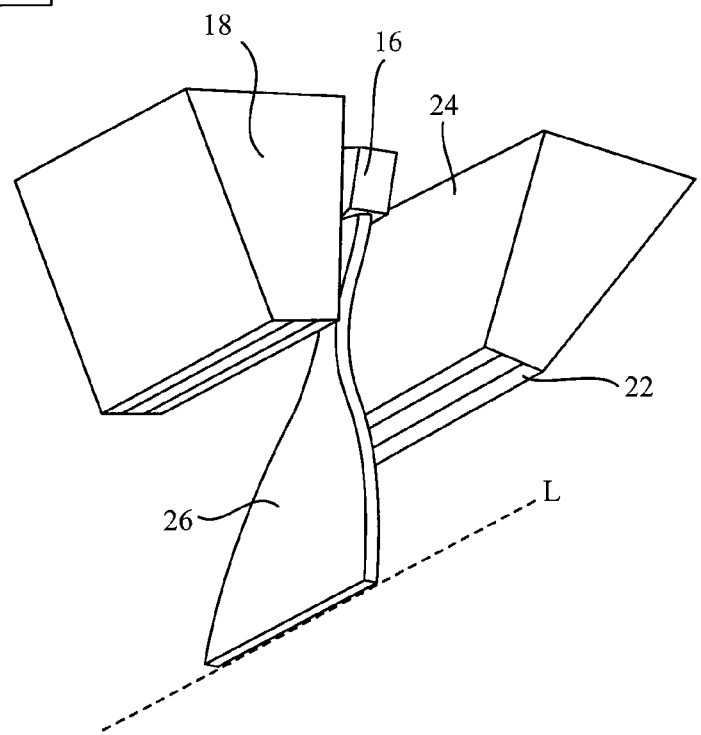
FIG. 2 depicts a perspective view of the system of FIG. 1, in accordance with some examples.

In accordance with various examples discussed herein, an apparatus for non-contact growth of crystalline bodies is provided. FIG. 1 depicts a cross-sectional view of a system for fabricating crystalline bodies in accordance with at least some examples of the present disclosure. FIG. 2 depicts a perspective view of the system of FIG. 1. The system for forming crystalline bodies may include one or more of a crucible 12, a molten crystalline material 14, a support 16, plenums 18, pathways 20, nozzles 22, a seed crystal 24 and a crystalline body 26. The system may define a translation axis T, a growth axis L, and a growth axis W.

In some examples, the system may include a crucible 12 for containing a molten crystalline material, hereinafter referred to as melt 14, a support 16, and one or more plenums 18 positioned proximate the melt 14, which define pathways 20 terminating in nozzles 22. As will be discussed further below, a seed crystal 24 may be mounted on the support 16 and introduced into the melt 14 to initiate formation of a crystalline body 26. The crystalline body 24 may grow along an axis L, hereinafter referred to as "in length," and along an axis W, hereinafter referred to as "in width."

In one implementation, crucible 12 may be composed of a material or combination of materials which are substantially inert and are not substantially degraded by the melt 14 such as, for example, quartz. In further implementations, crucible 12 may be composed of any suitable material for containing a molten crystal material.

In certain implementations, melt 14 may be composed of any material or combination of materials suitable for forming crystalline bodies by means of seed crystal introduction to a crystalline melt. For example, melt 14 may be composed of semiconductors (e.g., silicon, Si, germanium, Ge, gallium arsenide, GaAs), metals (e.g., palladium, Pd, platinum, Pt, silver, Ag, gold, Au, copper, Cu, aluminum, Al, nickel, Ni), salts, synthetic gemstones, and the like. In a particular implementation, melt 14 may comprise silicon, particularly, high-purity, semiconductor grade silicon. In instances where the melt 14 is silicon, dopant impurity atoms such as boron (B), phosphorus (P), and the like can be added to the melt 14 in order to dope the silicon, and thus form n-type or p-type extrinsic silicon. As will be appreciated by those skilled in the art, such doping can influence the electrical conductivity of the silicon.

In some examples, a support 16 may be movably arranged proximate the crucible 12. Generally, the support 16 may be used to mount a seed crystal 26 for introduction into the melt 14 as well as subsequent removal of the seed crystal 26 from the melt at a controlled rate to produce a crystalline body 24. In this regard, in some implementations, the support 16 may be operatively coupled to a suitable drive mechanism such that such that the support 16 is movable relative to the crucible 12 along a translation axis T in a dip direction indicated by directional arrow 28 and a pull direction indicated by directional arrow 30. As will be discussed further below, the rate at which the seed crystal may be pulled from the melt, hereinafter referred to as the pull rate, may, in part, influence the shape of the growing crystalline body 24. In further examples, support 16 may be configured for additional movement such as, for example, rotational, vibrational, linear or non-linear movements. While the present disclosure is described with respect to embodiments wherein the material for initializing growth (i.e., the seed) is a crystal, it is to be appreciated that the seed may be provided in any form suitable for initiating growth, such as a rod.

In some examples, to facilitate formation of thin sheet crystalline bodies, support 16 may be configured as an elongated plate extending longitudinally in a direction that is substantially parallel to the growth axis L. In some other examples, support 16 may be configured in any suitable shape for accommodating introduction of a seed crystal into a melt such as, for example, a rod or shaft.

In some implementations, one or more plenums 18 may be positioned proximate the melt 14. As shown, two plenums 18 may be provided opposite one another with respect to the translation axis T. In some other implementations, any number of additional plenums may be employed. Generally, the plenums 18 may be used to precisely direct an impinging fluid to opposing sides of a growing crystalline body 24 such that the a desired shape of the crystalline body 24 may be achieved. In one implementation, the impinging fluid may be composed of an inert gas such as, for example, nitrogen or argon.

In illustrative examples, plenums 18 may define one or more fluid pathways 19, which may be coupled to a suitable mechanism for supplying an impinging fluid at a controlled rate. As with the pull rate, the flow rate of the impinging fluid may be manipulated to influence the shape of the growing crystalline body. As shown, fluid pathways 19 may terminate in one or more nozzles 22 positioned proximate the melt 14. In some examples, to accommodate shaping of the growing crystalline body 24, plenums 18, and thus nozzles 22 may be positioned relative to the melt 14, shaft 16, and/or seed crystal 26 such that the that impinging fluid discharged from the nozzles 22 impacts the growing sheet 24 prior to solidification of the melt material. As will be appreciated by those skilled in the art, the crystalline body may be formed as the molten material solidifies as it is drawn from the melt, and shaping of the crystalline body may be possible only prior to solidification of the molten material. Accordingly, premature solidification of the molten material may be undesirable.

In some examples, to further facilitate prevention of premature solidification of the melt material, the impinging fluid may be heated. In one implementation, the impinging fluid may be heated to substantially near the melting point of the melt material such as, for example, the melting point+/−1° C. Any suitable means for heating and precisely controlling the temperature of the impinging fluid may be employed. For example, the impinging fluid may be heated by means of heating coils disposed within the plenums 18.

In various implementations, the nozzles 22 may be configured to form crystalline bodies having a desired shape such as, for example, thin-sheet crystalline bodies. For example, in one implementation, shown in FIG. 2, nozzles 22 may be formed as elongated linear openings, or slits, extending through a bottom surface of the plenums 18 which is proximate the melt 14. As will be appreciated in light of the present disclosure, an impinging fluid discharged from such nozzles may form a generally downward flowing curtain of fluid. In this manner, the impinging fluid may "squeeze" opposing sides of the growing crystalline body, thereby promoting expansion of the crystalline body 24 in length, and limiting expansion of the crystalline body in width (i.e, the impinging fluid "squeezes" the crystalline body into a thin sheet). Alternatively, nozzles 22 may be provided in any shape suitable for forming a desired crystalline body shape.

In some examples, systems and methods as described herein may further include a computer controlled system for controlling the growth of crystalline bodies. The computer controlled system may include a computing system operatively associated with any or all of the system components which effect process parameters, and be configured for monitoring and/or controlling one or more of the process parameters (e.g., pull rate, impinging fluid flow rate, impinging fluid temperature) In one implementation the computing system may be configured to dynamically modify one or more of the process parameters such that a desired size and/or shape of the crystalline body 24 may be achieved.

Figure 3:
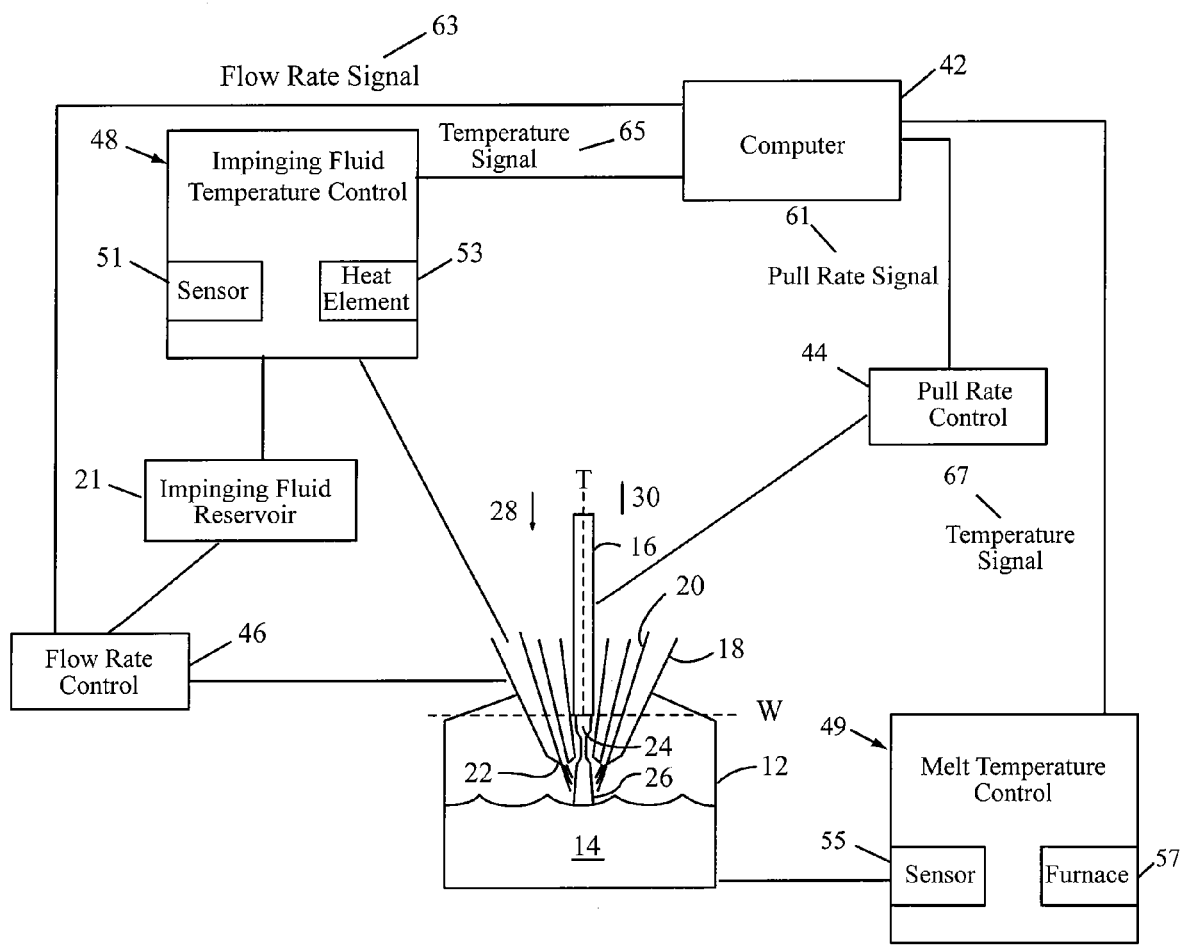
FIG. 3 depicts a computer controlled system for controlling the growth of crystalline bodies in accordance with some examples.

FIG. 3 depicts a computer controlled system for controlling the growth of crystalline bodies in accordance with some examples. The computer controlled system may include one or more of a crucible 12, a molten crystalline material 14, a support 16, plenums 18, pathways 20, an impinging fluid reservoir 21, nozzles 22, a seed crystal 24, a crystalline body 26, a computer 42, a pull rate control 44, a flow rate control 46, an impinging fluid control 48 including a sensor 51 and a heat element 53, a melt temperature control including a sensor 55 and a furnace 57, a flow rate signal 63, a temperature signal 65, and a temperature signal 67.

In some examples, the computer controlled system may include a computer 42 in operative communication with a pull rate control 44, an impinging fluid flow rate control 46, an impinging fluid temperature control 48, and a melt temperature control 49. Generally, the computer 42 may include a processor configured to receive data from and/or transmit instructions to any or all of the pull rate control 44, such as pull rate signals 61, the impinging fluid flow rate control 46, such as flow rate signals 63, the impinging fluid temperature control 48, such as temperature signals 65, and the melt temperature control 49, such as temperature signals 67, to facilitate control of the various process parameters.

In various examples, the pull rate control 44 may be operatively coupled to the support 16 such that such that the support 16 is movable relative to the crucible 12 along the translation axis T in both the dip and pull directions at a controlled rate. The pull rate control 44 may include, for example, any linear or non-linear actuator, such as a motor or hydraulic control.

In illustrative examples, the impinging fluid flow rate control 46 may be operatively coupled to an impinging fluid reservoir 21, the plenums 18, and/or the fluid pathways 20 such that the impinging fluid may be delivered through the nozzles 22 at a controlled rate. The impinging fluid flow rate control 46 may include any suitable mechanism for supplying an impinging fluid at a controlled rate, such as a blower or a pump, and/or a controllable valve associated therewith.

In some examples, the impinging fluid temperature control 48 may be operatively coupled to the impinging fluid reservoir 21, plenums 18 and/or the fluid pathways 20 such that the impinging fluid may be delivered through the nozzles 22 at a controlled temperature. The impinging fluid temperature control 48 may include a temperature sensor 51 and a suitable mechanism for heating the impinging fluid, such as a heating element 53 coupled to the fluid reservoir 21, plenums 18 and/or fluid pathways 20.

In various examples, the melt temperature control 49 may be operatively coupled to the crucible 12 and/or the melt 14 such that the temperature of the melt 14 may be provided at a controlled temperature. The melt temperature control 49 may include a temperature sensor 55 and a suitable mechanism for heating the melt, such as a furnace 57 disposed proximate the crucible 12.

Figure 4:
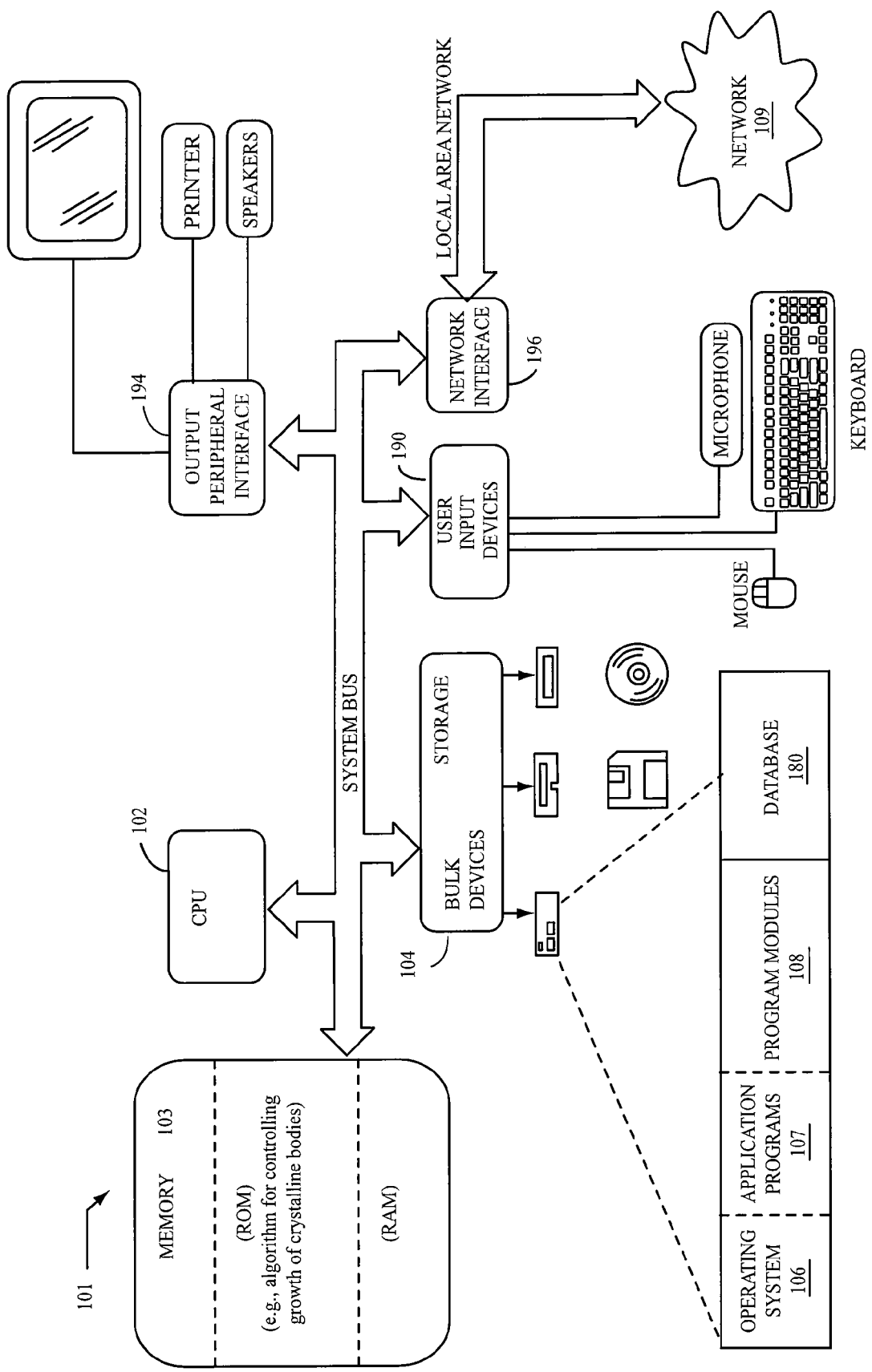
FIG. 4 depicts a computing system for implementing examples of the present disclosure.

With reference to FIG. 4, depicted is a computing system for implementing examples of the present disclosure. The computing system of FIG. 4 includes a computer 101, including a central processing unit (CPU), also referred to as a processor, 102, main memory 103 and one or more bulk storage devices 104. The processor 102 may generally be of any desired configuration including but not limited to a microprocessor (μP), a microcontroller (μC), a digital signal processor (DSP), or any combination thereof. Thus, individual processors 102 may include logic for executing program instructions as well as other functional blocks such as an arithmetic logic unit (ALU), a floating point unit (FPU), a digital signal processing (DSP) core, registers, accumulators, etc. The main memory 103, which may be any suitable form of memory including, but not limited to, volatile memory such as random access memory (RAM), non-volatile memory such as read only memory (ROM) and flash memory storage, data storage devices such as magnetic disk storage (e.g., hard disk drive or HDD), tape storage, optical storage (e.g., compact disk or CD, digital versatile disk or DVD), or other machine-readable storage mediums that may be removable, non-removable, volatile or non-volatile. An algorithm for controlling growth of crystalline bodies may be provided in the main memory 103, such as, for example, in the ROM.

The bulk storage devices 104 and their associated computer storage media provide storage of computer readable instructions, data structures, program modules and other data for the computer 101. The bulk storage devices 104 may also include an operating system 106, application programs 107, program modules 108, and a database 180. The computer 101 further includes user input devices 190 through which a user may enter commands and data. Input devices may include an electronic digitizer, a microphone, a keyboard and pointing device, commonly referred to as a mouse, trackball or touch pad. Other input devices may include a joystick, game pad, satellite dish, scanner, or the like.

These and other input devices may be coupled to the processor 102 through a user input interface that is coupled to a system bus, but may be coupled by other interface and bus structures, such as a parallel port, game port or a universal serial bus (USB). Computers such as computer 101 may also include other peripheral output devices such as speakers, which may be coupled through an output peripheral interface 194 or the like.

The computer 101 may operate in a networked environment using logical connections to one or more computers, such as a remote computer coupled to network interface 196. The remote computer may be a personal computer, a server, a router, a network PC, a peer device or other common network node, and may include many or all of the elements described above relative to computer 101. The remote computer may be considered the other of the client or the server depending on the designation of the computer 101. Networking environments are commonplace in offices, enterprise-wide area networks (WAN), local area networks (LAN), intranets and the Internet. Source and destination machines need not be coupled by a network 109 or any other means, but instead, data may be migrated via any media capable of being written by the source platform and read by the destination platform or platforms. When used in a LAN or WLAN networking environment, the computer 101 is coupled to the LAN through a network interface 196 or an adapter. When used in a WAN networking environment, computer 101 typically includes a modem or other means for establishing communications over the WAN, such as the Internet or network 109. It will be appreciated that other means of establishing a communications link between the computers may be used.

In operation, a seed crystal 26 may be mounted on the support 16 and dipped into the melt 14. Subsequently, the seed crystal 26 may be drawn from the melt 14 by movement of the support 16 in the pull direction. As the seed crystal 26 is drawn up, a crystalline body 24 begins to grow. An impinging fluid, discharged from nozzles 22 may be directed to opposing sides of the growing crystalline body 24 prior to solidification of the melt material. The impinging fluid may provide a squeezing or pressing force to the growing crystalline body 24, which may result in substantial expansion of the crystalline body in the longitudinal direction and limited expansion in the "width", thereby forming a thin sheet crystalline body. During the formation process, the process parameters may be precisely controlled/modified to achieve a desired crystalline body shape, as discussed with respect to FIG. 3.

In some implementations, practice of the systems and methods described herein may produce thin-sheet crystalline bodies having a desired thickness. In one example, the crystalline bodies may range between approximately 0.01 to tens of microns in thickness. Such crystalline bodies may be suitable for use as so-called thin-films. In other examples, the crystalline bodies may range between approximately 0.01 to hundreds of microns in thickness. In still further embodiments, crystalline bodies may range between approximately 0.001 to three millimeters in thickness. Such crystalline bodies may be suitable for use as, for example, a substrate material for a solar cell.

In illustrative examples, large area crystalline bodies (e.g., thin-sheets) may be formed by systems and methods described herein. In some examples, the large area crystalline bodies may have a thickness which renders the bodies suitable for use as a finished product, such as a substrate. In other examples, the large area crystalline bodies may have a thickness which is greater than that which is suitable for use as a finished product. Accordingly, in some implementations, the large area crystalline body may be cut, or sliced, using known methods. More particularly, in one implementation, the large area crystalline bodies may be sliced in a direction that is substantially parallel to the longitudinal dimension of the crystalline body to produce a plurality of large area crystalline bodies having a thickness that is suitable for a desired finished product. The amount of cutting required to produce a suitably dimensioned finished product using the systems and methods described herein may be substantially less than that required under traditional methods, which, as discussed above, may involve slicing a cylindrical ingot in a direction that is transverse to the longitudinal dimension of the cylindrical ingot to produce a plurality of wafers. In various examples, after the optional cutting, the large area crystalline bodies may be polished as necessary using well known methods. In various examples, the finished products may undergo any number of microfabrication process steps such as, for example, doping, ion implantation, etching, deposition of various materials, and photolithographic patterning.

In further examples, the finished products may serve as a substrate for microelectronic devices that may be built in and over the finished product such as, for example, a solar cell, integrated circuit, or the like. More specifically, in one example, the finished products may serve as a substrate for microelectronic devices built in and over a surface of the substrate whose surface normal pointed in a direction which was substantially perpendicular to the translation axis T during the formation process described herein. In instances where the finished products serve as substrates for a solar cell, due to the large surface area of the finished products, the finished products may comprise the entire substrate surface, or a substantial portion of the entire substrate surface of the solar cell, thereby eliminating or substantially reducing the need for tiling and wiring of substrates required under the traditional methods.

In certain examples, a substrate for a finished product such as a solar cell may have a diameter of from approximately 150 mm to approximately 200 mm and a thickness of from approximately 200 microns to approximately 250 microns. The substrate may be polished to a smooth surface. Generally, the substrate may be lightly p-doped. An example p-type dopant may be boron (B). To form a finished product, an n-type dopant may be diffused onto the surface of the p-doped substrate to form a p-n junction. The p-n junction may be formed approximately a few hundred nanometers below the surface. An example n-type dopant may be phosphorus. The surface may then be coated with an anti-reflection coating. Suitable anti-reflection coatings may include, for example, silicon nitride ($Si_3N_4$) or titanium dioxide ($TiO_2$). The anti-reflection coating may be applied in a thickness of, for example, several hundred nanometers using, for example plasma-enhanced vapor deposition (PECVD). In some examples, instead of or in addition to the anti-reflection coating, the substrate may be provided with a textured front surface. The substrate at this point may be referred to as a "wafer."

A full area metal contact may be printed on a back surface of the wafer, and a grid-like metal contact made up of fine fingers and larger busbars may be printed on a front surface of the wafer. Such printing may be, for example, by screen-printing using a metal paste such as a silver or aluminum paste. In some examples, a silver paste may be used for the front surface and an aluminum paste may be used for the rear surface. The metal pastes may be utilized to create metal electrodes in ohmic contact with the silicon of the wafer. After the metal contacts are made, solar cells may be assembled into modules or solar panels, for example by interconnected the cells in series and/or in parallel. In some examples, a sheet of tempered glass may be provided over the front surface of the solar panel and a polymer encapsulation may be provided on the back surface of the solar panel.

In further examples, the finished products formed using the systems and methods described herein may be laminated to glass panels to form products suitable for use as windows. In still further examples, the finished products may be applied to a low cost substrate as a backing, such as a glass substrate containing underlying electrodes.

Figure 5:
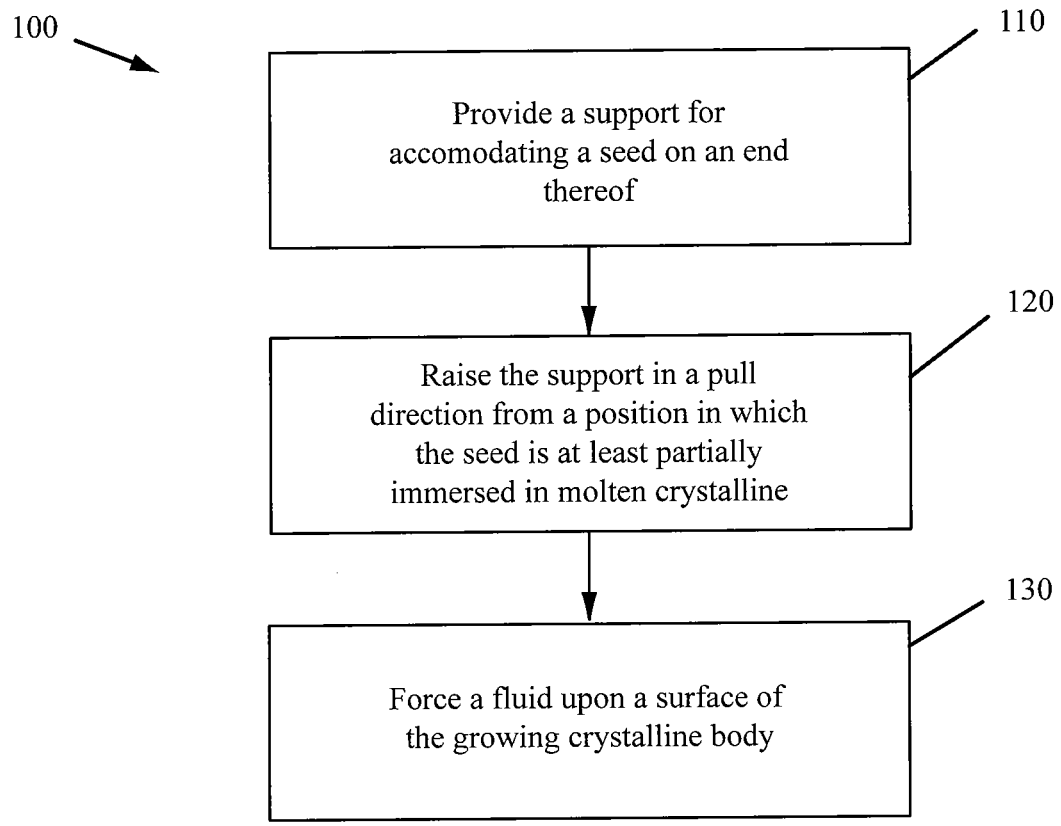
FIG. 5 depicts a process flow diagram of a method for manufacturing crystalline bodies in accordance with some examples, all arranged in accordance with the present disclosure.

FIG. 5 depicts a process flow diagram of a method 100 for manufacturing crystalline bodies in accordance with some examples of the present disclosure. The method 100 may include providing a support for accommodating a seed on an end thereof, the support being movable along a translation axis in a pull direction (block 110), raising the support in the pull direction from a position in which the seed is at least partially immersed in a molten crystalline material, thereby drawing the seed crystal from the molten crystalline to initiate growth of a crystalline body (block 120), and forcing a fluid upon a surface of the growing crystalline body (block 130).

The present disclosure is not to be limited in terms of the particular examples described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting. The foregoing describes various examples of fabrication of crystalline bodies. Following are specific examples of methods and systems of fabrication of crystalline bodies. These are for illustration only and are not intended to be limiting.

The present disclosure generally relates to systems and methods for forming crystalline bodies. In some examples, a device for forming crystalline bodies comprises a crucible for containing molten crystalline material, a support for accommodating a seed on an end thereof, the support being movable along a translation axis in a pull direction to draw the seed crystal from the molten crystalline, thereby initiating growth of a crystalline body along a growth path, and one or more nozzles configured to be coupled to a fluid source, the nozzles being positioned relative to the growth path for shaping the crystal body as the molten crystalline may be pulled in the pull direction along the growth path.

In various implementations, the crystalline body may define a molten portion and a solid portion, wherein multiple nozzles may be positioned relative to the crystalline body such that a fluid discharged from the nozzles impinges upon the molten portion. The nozzles may be configured such that the fluids discharged from the nozzles flow in a direction generally opposite the pull direction. The nozzles may comprise a discharge opening, the discharge openings being elongated. The discharge openings may be configured as linear openings (or non-linear openings in some examples) for forming the crystalline body into a generally flat sheet.

In some examples, the support may comprise an elongated cross-section. A fluid discharged from the nozzles may comprise an inert gas (e.g., Nitrogen, Ni, Argon, Ar, etc.). Fluid discharged from the nozzles may be heated to approximately the melting point of the crystalline material. The device may comprise one or more pairs of nozzles, wherein each nozzle of a nozzle pair is positioned substantially opposite the other relative to the translation axis. The device may be generally configured for controlling a thickness of the crystalline body. The molten crystalline material may comprise silicon (Si).

In illustrative implementations, a method for manufacturing crystalline bodies and devices from crystalline bodies may be provided. The method may include providing a support for accommodating a seed on an end thereof, the support being controllably movable along a translation axis in a pull direction, raising the support in the pull direction from a position in which the seed is at least partially immersed in a molten crystalline material, thereby drawing the seed crystal from the molten crystalline to initiate growth of a crystalline body, and applying a fluid to a surface of the growing crystalline body.

In various examples, the method may comprise the step of varying any or all of a flow rate of the fluid, a temperature of the fluid, and a pull rate of the support. The may comprise the step of making a device over a surface of the crystalline body whose surface normal pointed in a direction which was substantially perpendicular to the translation axis during raising of the support.

In some examples, a device for forming crystalline bodies may be provided. The device may comprise a crucible containing molten crystalline material, a support accommodating a growing crystalline body, the growing crystalline body having a molten portion on an end thereof proximate the molten crystalline material and a solid portion generally opposite the molten portion, wherein the support may be controllably movable along a translation axis in a pull direction to extend the solid portion, and one or more nozzles for applying a fluid to at least the molten portion of the growing crystalline body.

The foregoing detailed description has set forth various examples of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one example, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically matable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A method for manufacturing crystalline bodies and devices from crystalline bodies using a seed crystal, a molten crystalline material and a fluid, the method comprising:
   providing a support for accommodating the seed on an end thereof, the support being movable along a translation axis in a pull direction;
   raising the support in the pull direction from a position in which the seed is at least partially immersed in the molten crystalline material, thereby drawing the seed crystal from the molten crystalline to initiate growth of a crystalline body;
   positioning one or more nozzles relative to the crystalline body, wherein the crystalline body includes a molten portion and a solid portion;
   heating the fluid to approximately the melting point of the crystalline material; and
   forcing the fluid upon a surface of the growing crystalline body to expand the crystalline body in length, including discharging the fluid through the one or more nozzles to the surface of the crystalline body such that the fluid discharged from the one or more nozzles impinges upon the molten portion, and
   wherein the heating occurs prior to forcing the fluid upon the surface of the growing crystalline body.

2. The method of claim 1,
   wherein discharging the fluid further comprises discharging the fluid in a direction generally opposite the pull direction.

3. The method of claim 2, wherein discharging the fluid further comprises discharging the fluid through a discharge opening in the one or more nozzles that is substantially elongated in shape.

4. The method of claim 2, wherein discharging the fluid further comprises discharging the fluid through a discharge opening in the one or more nozzles that is configured as a linear opening for forming the crystalline body into a generally flat sheet.

5. The method of claim 1, wherein the support comprises an elongated cross-section.

6. The method of claim 1, wherein the fluid comprises an inert gas.

7. The method of claim 1, wherein the molten crystalline material comprises silicon.

8. The method of claim 1, the method further comprising varying one or more of a flow rate associated with forcing the fluid upon the surface, a temperature of the fluid, and a pull rate associated with raising the support in the pull direction.

9. The method of claim 1, the method further comprising using a surface of the crystalline body as a substrate for making a microelectronic device, the surface having a surface normal that pointed in a direction which was substantially perpendicular to the translation axis during raising of the support.

* * * * *

UNITED STATES PATENT AND TRADEMARK OFFICE
CERTIFICATE OF CORRECTION

| | | |
|---|---|---|
| PATENT NO. | : 8,790,460 B2 | Page 1 of 1 |
| APPLICATION NO. | : 12/467753 | |
| DATED | : July 29, 2014 | |
| INVENTOR(S) | : Bang | |

It is certified that error appears in the above-identified patent and that said Letters Patent is hereby corrected as shown below:

On the Title Page, in Item (75), under "Inventor", in Column 1, Line 1, delete "A" and insert -- A. --, therefor.

In the Specification:

In Column 3, Line 32, delete "the a" and insert -- a --, therefor.

In Column 9, Line 3, delete "The may" and insert -- The method may --, therefor.

In Column 9, Line 41, "and or" and insert -- and/or --, therefor.

Signed and Sealed this
Eighteenth Day of November, 2014

Michelle K. Lee
*Deputy Director of the United States Patent and Trademark Office*